United States Patent [19]
Norton

[11] Patent Number: 5,373,182
[45] Date of Patent: Dec. 13, 1994

[54] INTEGRATED IR AND VISIBLE DETECTOR

[75] Inventor: Paul R. Norton, Santa Barbara, Calif.

[73] Assignee: Santa Barbara Research Center, Goleta, Calif.

[21] Appl. No.: 3,715

[22] Filed: Jan. 12, 1993

[51] Int. Cl.$^5$ .................... H01L 27/14; H01L 31/00
[52] U.S. Cl. ............................. 257/440; 257/442; 257/451
[58] Field of Search ............. 257/440, 442, 451, 188, 257/189

[56] References Cited

U.S. PATENT DOCUMENTS

| | | | |
|---|---|---|---|
| 3,547,546 | 12/1970 | Schier | 350/162 |
| 4,626,675 | 12/1986 | Gundner et al. | 257/440 |
| 4,965,649 | 10/1990 | Zanio et al. | 257/442 |
| 4,994,664 | 2/1991 | Veldkamp | 250/216 |
| 5,132,251 | 7/1992 | Kim et al. | 257/440 |
| 5,149,956 | 9/1992 | Norton | 257/188 |

FOREIGN PATENT DOCUMENTS

| | | | |
|---|---|---|---|
| 2155269 | 6/1990 | Japan | 257/442 |
| 318069 | 1/1991 | Japan | 257/440 |
| 3201571 | 9/1991 | Japan | 257/440 |

OTHER PUBLICATIONS

"Optical Design with Diffractive Lenses" by D. Falkis and G. M. Morris, Photonics Spectra, Nov. 1991, pp. 205–208.

"Binary Optics", by W. B. Veldkamp and T. J. McHugh, Scientific American, May 1992, pp. 92–97.

"Coherent Addition of AlGaAs Lasers Using microlenses and Diffractive Coupling" by J. R. Leger et al., Appl. Phys. Lett. 52(21), May 23, 1988, pp. 1771–1772.

"Coherent Laser Beam Addition: An Application of Binary-Optics Technology" by J. R. Leger et al., The Lincoln Laboratory Journal, vol. 1, No. 2, 1988 pp. 225–245.

Primary Examiner—Andrew J. James
Assistant Examiner—Stephen D. Meier
Attorney, Agent, or Firm—W. C. Schubert; W. K. Denson-Low

[57] ABSTRACT

A radiation detector (1) includes a multi-layered substrate (2,10) having a first major surface, which is a radiation receiving surface, and a second major surface disposed opposite to the first major surface. A first detector is formed adjacent to the first major surface, the first detector being responsive to a wavelength or wavelengths of electromagnetic radiation in the range of approximately 0.3 micrometers (near-UV) to approximately 1.2 micrometers (near-IR). A second detector is formed adjacent to the second major surface of the multi-layered substrate, the second detector being responsive to a wavelength or wavelengths of electromagnetic radiation in the range of approximately one micrometer to approximately twenty micrometers (SWIR to VLWIR). In a presently preferred embodiment the second detector is simultaneously responsive to IR radiation within two distinct spectral bands.

7 Claims, 4 Drawing Sheets

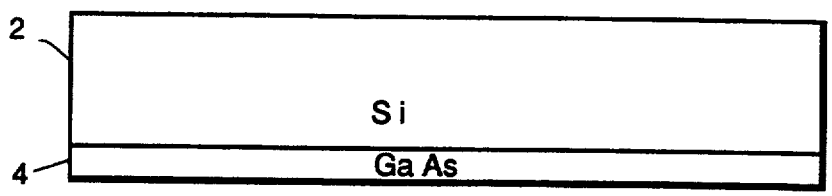
FIG. 1a.
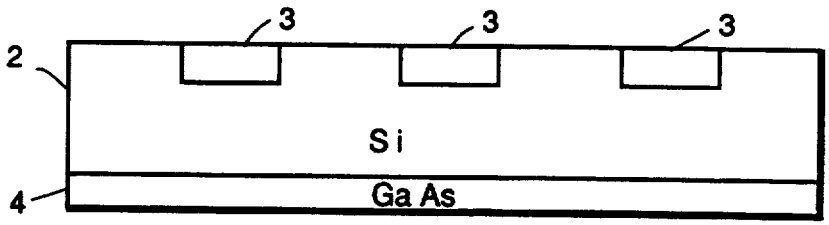
FIG. 1b.
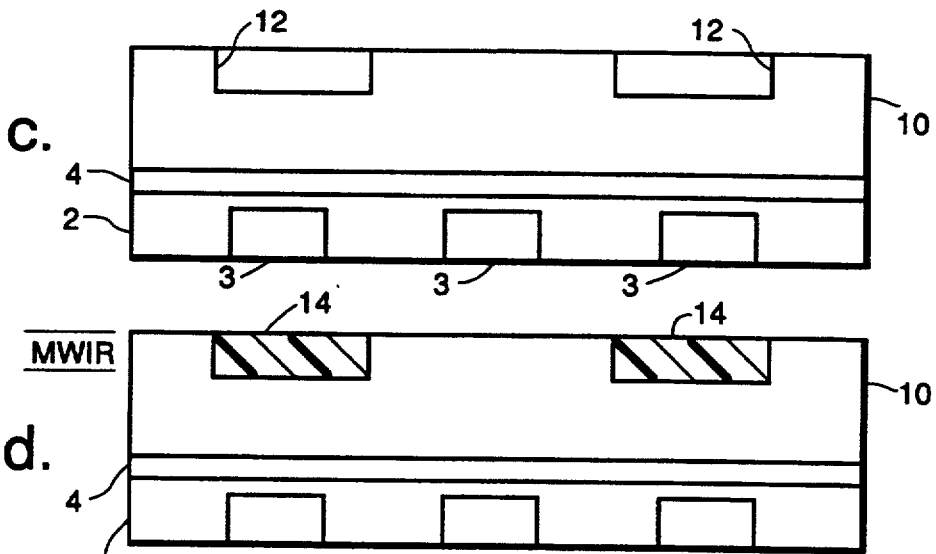
FIG. 1c.
FIG. 1d.
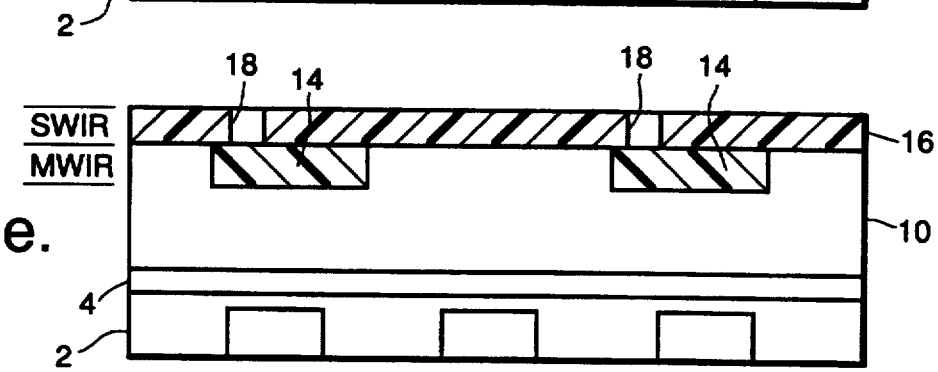
FIG. 1e.
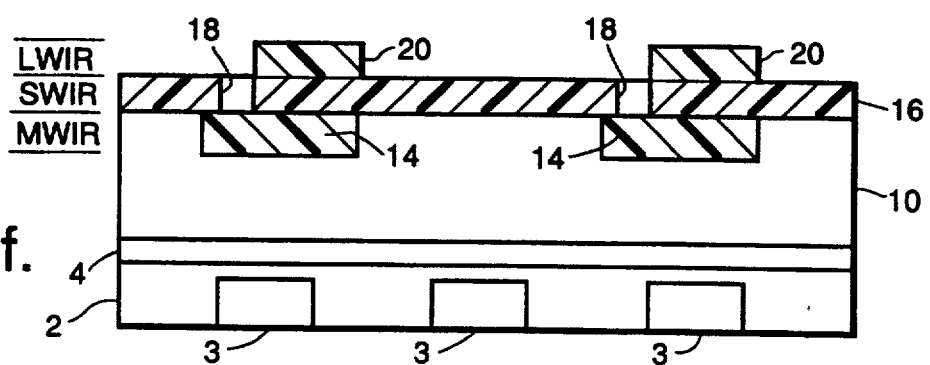
FIG. 1f.

5,373,182

INTEGRATED IR AND VISIBLE DETECTOR

CROSS-REFERENCE TO RELATED PATENT APPLICATION

This patent application is related to commonly assigned U.S. patent application Ser. No. 07/014,938, filed Feb. 8, 1993, entitled "Integrated IR and MM-Wave Detector", by Paul Norton.

FIELD OF THE INVENTION

This invention relates generally to radiation detectors and, in particular, to detectors sensitive to "visible" radiation, having wavelengths in the range of approximately 1.2 micrometers to approximately 0.3 micrometers, and to detectors sensitive to radiation within the infrared (IR) spectrum, having wavelengths within the range of approximately one micrometer to approximately 20 micrometers.

BACKGROUND OF THE INVENTION

Detectors of visible wavelength radiation and detectors of IR radiation are both well known in the art. One known material that is well-suited to fabricating visible wavelength detectors and associated circuitry is Silicon. IR detectors are typically fabricated from material selected from Group II-VI of the period table, such as $Hg_{(1-x)}Cd_xTe$, wherein x may vary within a range of approximately 0.2 for long wavelength IR (LWIR) to a value of approximately 0.4 for short wavelength IR (SWIR).

For some applications it may be desirable to provide both visible wavelength and IR radiation detectors for simultaneously viewing a scene that include a source of visible wavelength radiation and also a source of IR radiation. However, the fabrication of a detector or detectors, from one type of material, that is responsive to both sources of radiation is difficult to achieve. One such material is InSb, which is known to be useful for fabricating sensors that are sensitive in both the visible and the IR spectrums. However, this type of sensor cannot distinguish the resulting visible signals from the IR signals.

It is thus an object of the invention to provide an integrated detector that is responsive to visible wavelength radiation and also to IR radiation, and which provides outputs expressive of a magnitude of each type of radiation.

It is a further object of the invention to provide a hybrid visible/IR detector assembly having a single common optical aperture, the assembly furthermore providing output signals that are separately expressive of a magnitude of each type of radiation.

It is one further object of the invention to provide a hybrid detector that is responsive to visible wavelength radiation and also to at least two different wavelengths (two colors) of IR radiation, and which provides outputs expressive of a magnitude of radiation at the visible wavelength and at each of the IR wavelengths.

SUMMARY OF THE INVENTION

The foregoing and other problems are overcome and the objects of the invention are realized by a hybrid radiation detector that includes a multi-layered substrate having a first major surface, which is a radiation receiving surface, and a second major surface disposed opposite to the first major surface. A first detector is formed adjacent to the first major surface, the first detector being responsive to a wavelength or wavelengths of electromagnetic radiation in the range of approximately 0.3 micrometers (near-UV) to approximately 1.2 micrometers (near-IR). These wavelengths are referred to herein as "visible" wavelengths, although in actuality the human eye is not sensitive to this entire spectrum. A second detector is formed adjacent to the second major surface of the multi-layered substrate, the second detector being responsive to a wavelength or wavelengths of electromagnetic radiation in the range of approximately one micrometer to approximately twenty micrometers (SWIR to VLWIR). In a presently preferred embodiment the second detector is simultaneously responsive to IR radiation within two distinct spectral bands.

In an illustrative embodiment, the first detector is comprised of a Group IV semiconductor material, such as Si or Si/Ge, and the second detector is comprised of a Group II-VI semiconductor material, such as HgCgTe. A lattice-mismatch accommodation layer comprised of, by example GaAs, may be interposed between the first and the second detectors.

In the illustrative embodiment a microlens is provided upon the radiation receiving surface of the multi-layered substrate for focussing incident IR radiation through the multi-layered substrate for reception by the second detector.

BRIEF DESCRIPTION OF THE DRAWING

The above set forth and other features of the invention are made more apparent in the ensuing Detailed Description of the Invention when read in conjunction with the attached Drawing, wherein:

FIGS. 1a-1g show in cross section, not to scale, a hybrid visible/two-color IR detector fabricated in accordance with steps of a method of the invention;

DETAILED DESCRIPTION OF THE INVENTION

Figure 1G:
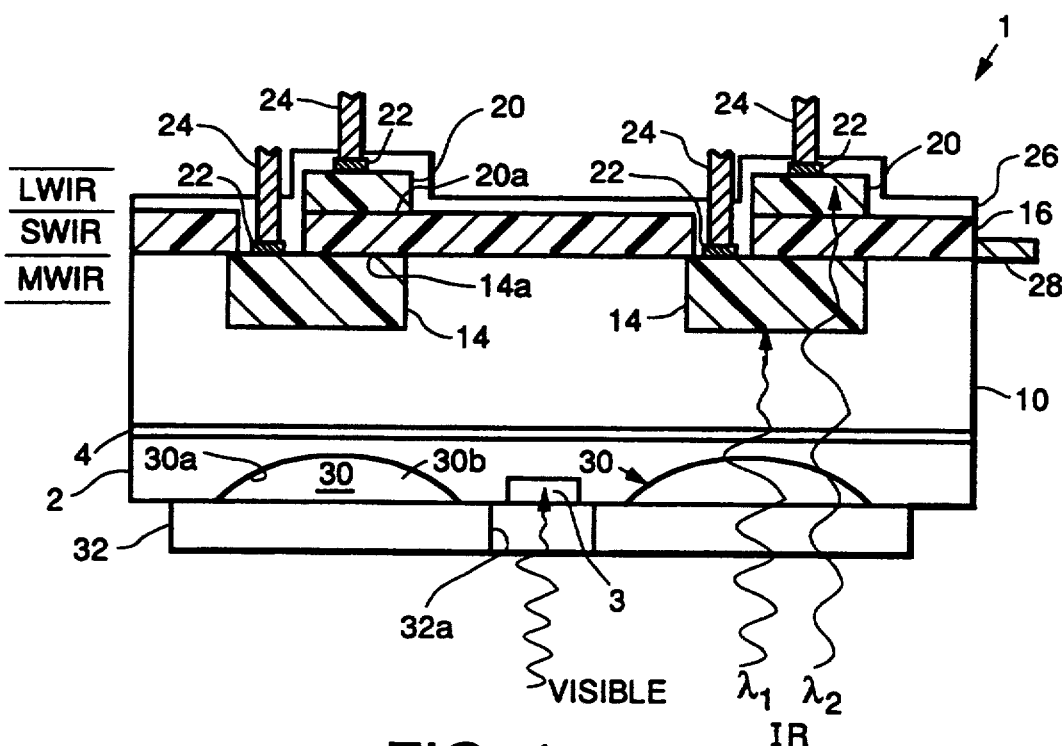

Referring first to FIGS. 1a-1g there is illustrated in cross section, not to scale, a hybrid visible radiation and two-color IR photodetector array 1 that is fabricated in accordance with a method of the invention. Although the array 1 is depicted as having a two-by-two square array of IR radiation detectors, as seen in FIG. 2, it should be realized that the teaching of the invention extends to other array configurations, such as linear arrays, and to arrays comprised of more or less than four IR detector sites.

As employed herein, Group IV material is intended to encompass Group IVA of the periodic table and to include, by example, the elements Si, Ge, and Sn. Group III-V is intended to encompass Groups IIIA and VA and to include, by example, the elements Al, Ga, In, P, As, and Sb. Group II-VI is intended to encompass Groups IIB and VIA and to include, by example, the elements Zn, Cd, Hg, S, Se, and Te.

In FIG. 1a a silicon substrate 2 is provided. An optional lattice-mismatch accommodation layer 4 is grown upon a major surface thereof by Metal-organic Chemical Vapor Deposition (MOCVD) or other suitable epitaxial growth technique. One suitable material for the layer 4 is GaAs, the GaAs layer being employed for substantially lattice matching the Si substrate 2 to a subsequently grown semiconductor layer comprised of Group II-VI material. A suitable thickness for the substrate 2 is within a range of approximately 100 micrometers to approximately 500 micrometers. A suitable thickness for the GaAs lattice accommodation layer 4 is approximately two micrometers.

It is noted that the next formed Silicon device structures, in the absence of Aluminum metalization, are capable of surviving the processing cycle used for the subsequently formed HgCdTe detectors. The GaAs layer 4, if present, is protected during the Silicon sensor processing by a cap layer of, for example, silicon nitride (not shown). This cap layer is subsequently removed prior to the step of depositing the Group II-VI substrate material over the lattice accommodation layer 4.

In FIG. 1b, and in accordance with known techniques and processing methodologies, a plurality of visible radiation detector sites 3, for example photodiodes, are defined upon a first major surface of the Si substrate 2. By example only, the Si substrate 2 may be doped p-type with boron and the sites 3 may be n-type regions doped with phosphorus. The resulting structure is further processed by any of a number of known techniques for fabricating, by example only, a Charge Coupled Device (CCD). The CCD may also include support circuitry, such as charge amplifiers and analog shift registers (not shown), for reading out visible radiation-induced charge and for coupling the CCD to external readout circuitry.

Having thus formed the visible radiation detectors 3 and, optionally, the lattice accommodation layer 4, the method continues to form the two-color IR radiation detectors. This aspect of the invention is described below in the context of a two-color IR detector fabrication method as described in commonly assigned U.S. Pat. No. 5,149,956, issued Sep. 22, 1992, entitled "Two-Color Radiation Detector Array and Methods of Fabricating Same", by Paul R. Norton. However, the use of other two-color IR embodiments are also within the scope of the invention.

In FIG. 1c an electrically insulating substrate 10 is grown over the GaAs layer 4, if provided, or directly over the surface of the Silicon substrate 2. The substrate 10 has moats or wells 12 etched into a first major surface thereof. The substrate 10 has a typical thickness of 15 micrometers and is comprised of a Group II-VI material, such as CdZnTe, that is substantially transparent to IR radiation having wavelengths of interest. Each well 12 is formed at a location wherein it is desired to fabricate an individual two-color photodetector. Each of the wells has a typical width of approximately 40 micrometers and a depth of approximately 5 to 10 micrometers. A photolithographic technique is employed to define the well 12 positions upon the substrate 10 surface, with a subsequent etching step being used to remove the substrate 10 material. A bromine wet etch is one suitable etching technique.

FIG. 1d shows that each of the wells 12 is filled with a first semiconductor material 14 selected for absorbing a first wavelength band of interest. For the illustrated embodiment the first wavelength band is MWIR.

As used herein SWIR radiation is considered to include a spectral region extending from approximately one micrometer to approximately three micrometers. MWIR radiation is considered to include a spectral region extending from approximately three micrometers to approximately eight micrometers, and LWIR radiation is considered to include a spectral region extending from approximately seven micrometers to approximately 14 micrometers. VLWIR radiation is considered to include a spectral region extending from approximately 12 micrometers to approximately 20 micrometers. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

For this embodiment of the invention the material 14 is comprised of epitaxial $Hg_{1-x}Cd_xTe$, wherein x is selected for providing absorption of MWIR radiation. Material 14 is n-type in order to function as a portion of a photodiode, as will be described. By example, n-type MWIR responsive material 14 is comprised of $Hg_{0.7}Cd_{0.3}Te$ having a thickness comparable to the depth of the well 12, or approximately 5 to 10 micrometers. Material 14 is doped with a donor species such as indium at a concentration of approximately $2 \times 10^{15}$ $cm^{-3}$.

The well 12 is preferably filled with the MWIR material 14 through an epitaxial deposition process, such as vapor phase epitaxy (VPE), liquid phase epitaxy (LPE), or chemical vapor deposition (CVD). After filling the wells 12 excess MWIR material is removed through a planarization process and the upper surface of the substrate 10 is prepared to accomplish a subsequent deposition step.

Referring to FIG. 1e this subsequent deposition step is shown to provide a substantially uniform epitaxial layer 16 comprised of SWIR semiconductor material. The SWIR material of layer 16 is also comprised of $Hg_{1-x}Cd_xTe$ wherein x is selected for providing absorption of SWIR radiation. The SWIR material is made p-type in order to form a plurality of first heterojunctions 14a with the underlying n-type material 14. By example, p-type SWIR responsive layer 16 is comprised of $Hg_{0.6}Cd_{0.4}Te$ having a thickness of approximately 3000 nm and is doped with an acceptor species such as arsenic at a concentration of approximately $1 \times 10^{17}$ $cm^{-3}$. The layer 16 may also be provided by an LPE, VPE or CVD process.

Openings 18 are formed in the SWIR layer 16 in order to provide for a subsequently formed electrical contact to the underlying MWIR material 14. The openings 18 may be etched through the layer 16 or the desired regions may be selectively masked before the deposition of the layer 16, with the masking material subsequently being removed by a lift-off process to form the openings 18.

FIG. 1f shows a plurality of LWIR regions 20 that are formed upon the SWIR layer 16 in registration with the underlying MWIR material 14. The LWIR material is also comprised of $Hg_{1-x}Cd_xTe$, wherein x is selected for providing absorption of LWIR radiation. The LWIR material is made n-type for forming a plurality of second heterojunctions 20a with the underlying p-type SWIR material of layer 16. By example, the n-type LWIR responsive regions 20 are comprised of $Hg_{0.8}Cd_{0.2}Te$ having a thickness of approximately 10 micrometers doped with a donor species such as indium at a concentration of approximately $2 \times 10^{15}$ cm$^{-3}$ LWIR regions 20 are formed by a photolithographic process-that includes depositing a patterned mask over the layer 16 and depositing the LWIR material within openings within the mask, the LWIR material being deposited by an epitaxial deposition process such as LPE, VPE or CVD.

Alternatively, the openings 18 are etched, either selectively or uniformly, after a LWIR-responsive layer is deposited, masked and selectively removed to form the LWIR regions 20.

In accordance with an aspect of the invention the MWIR material 14 and the LWIR material 20 are provided with the same type of electrical conductivity, either n-type or p-type, and the intervening SWIR layer 16 is provided with the opposite type of electrical conductivity. The resulting structure forms, for each photodetector element or pixel, two back-to-back photodiodes, having an n-p-n or p-n-p configuration.

It is important to note that the MWIR material 14 within each of the wells 12 is isolated from all other MWIR material regions. Similarly, the LWIR regions 20 are physically isolated from one another. However, the SWIR layer 16 is substantially contiguous across the array 1 (FIG. 2) of IR responsive devices, and thus provides a common electrical contact to each of the IR photodetectors of the array 1. The substantially uniform layer 16 is only broken at relatively small regions where the openings 18 are provided. This common contact beneficially enables the simultaneous operation of each of the back-to-back photodiodes and the simultaneous detection of radiation within two spectral bands. The photodiodes are operated with zero bias or with some amount of reverse bias potential.

Figure 2:
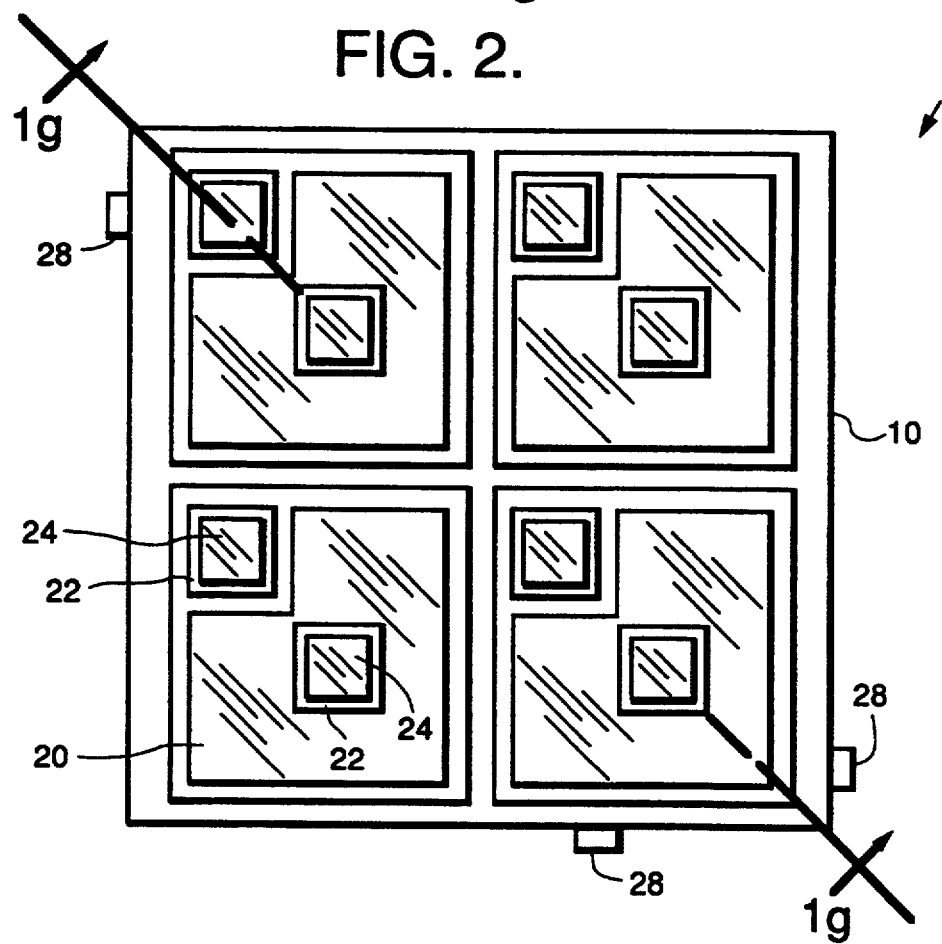
FIG. 2 is a back-side view, not to scale, showing an exemplary embodiment of a hybrid visible/two-color IR detector array fabricated in accordance with the method of the invention.

Referring now to FIG. 1g and FIG. 2 there is shown a completed array 1 after the performance of additional processing steps. FIG. 1g shows in cross-section the array 1 taken along the section line 1g—1g of the top view of FIG. 2. Specifically, a plurality of electrical contact pads 22, typically comprised of nickel, are deposited on the MWIR material 14 and the LWIR material 20. In order to make electrical contact to external IR readout electronics (not shown) a plurality of indium bumps 24 are formed in a conventional manner upon the contact pads 22. An electrically insulating layer of passivation 26 is provided over the surface of the device, the passivation 26 preferably being a semiconductor material selected to have a wider bandgap than the bandgaps of the layer 16 and the LWIR regions 20. A suitable material is CdTe. The passivation layer 26 functions to reduce surface recombination effects and other surface effect noise sources. An additional electrical connection 28 is provided at an edge or edges of the device for electrically coupling to the common SWIR layer 16.

Figure 3:
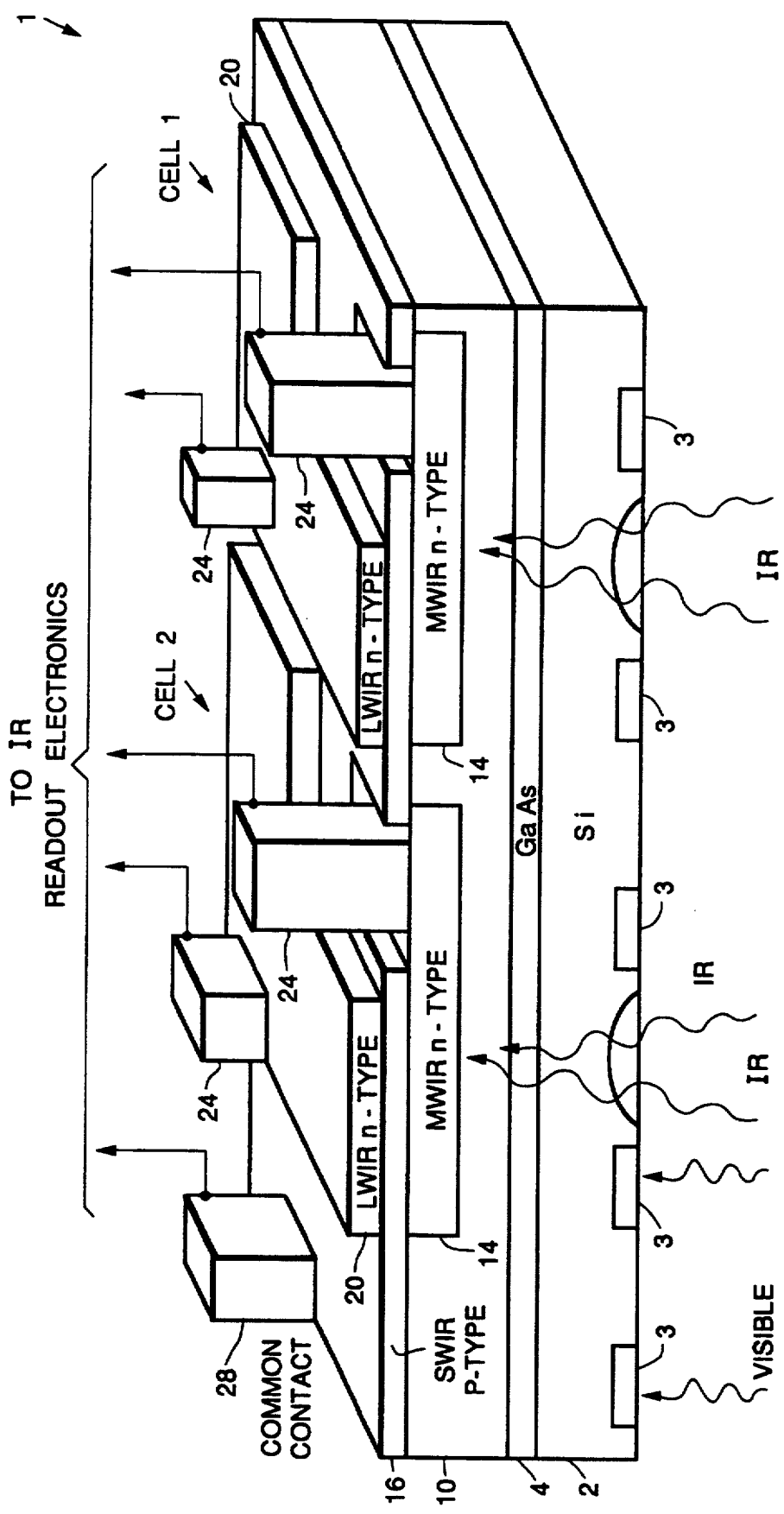
FIG. 3 is an elevational view, not to scale, of the exemplary embodiment of a visible/two-color IR radiation detector array fabricated in accordance with the invention.

In this regard, and as is shown in the top view of the array 1 of FIG. 2 and in the elevational view of FIG. 3, contact to the SWIR "ground plane" layer 16 is typically made at a plurality of locations around the periphery of the array 1. The electrical conductivity of the common SWIR layer 16 may be further enhanced by including a vertical and/or horizontal contact metal grid structure (not shown) in the region between the LWIR regions 20. Such metalization reduces contact or sheet resistance across the layer 16 so as to minimize electrical crosstalk between individual ones of the photodetectors. If provided, the grid metalization is preferably formed before the deposition of the passivation layer 26.

A binary or analog microlens may also be employed on or adjacent to the illuminated surface of the array 1. By example, a plurality of microlens elements 30 are fabricated within the Si substrate 2 such that one of the microlens elements 30 is disposed in registration with one of the backside IR two-color detectors. A bandpass filter stack or stacks 32 can also be employed on or adjacent to the backside surface of the substrate 10 in order to pass only wavelengths within selected spectral regions. An optional anti-reflection (AR) coating (not shown) can also be provided. It is noted that, since the filter stack 32 can obscure the visible detectors 3, apertures 32a are provided through the filter stack 32 so that the visible wavelengths are not blocked or attenuated.

Further in regard to the microlens element 30, such may be fabricated by a technique that etches a concave depression 30a at a site where a microlens is desired, with the depression subsequently being filled with a material 30b that is substantially transparent to IR radiation. Each microlens 30 is formed in registration with an underlying one of the p-n-p junctions for focussing the incident IR radiation on to the active junction region of the p-n-p structure. Also by example, a microlens may be fabricated as a multi-stepped binary lens that approximates a Fresnel zone plate for focussing the incident IR radiation onto an associated pair of back-to-back photodiodes.

In designing the microlenses 30 one consideration is the thicknesses of the Si substrate 2, lattice accommodation layer 4, and the CdZnTe substrate 10. These thicknesses play a role in establishing the focal length of the microlens 30. Another consideration in designing the microlenses 30 is the index of refraction of the Si substrate 2, and the changes of index of refraction at the boundaries of the lattice accommodation layer 4 and the CdZnTe substrate 10. Another consideration is the index of refraction of the material 30b that is selected to form the microlens.

Although in FIG. 3 the microlens element 30 is shown etched down into the Si substrate 2, it is also within the scope of the invention to selectively etch away the Si substrate 2 so as to form a binary microlens that protrudes in a convex manner from the surface of the Silicon substrate 2, instead of in the concave manner shown.

The specification and fabrication of such diffractive optical elements within a surface of a substrate is a known technique, and is described in, by example, an article entitled "Optical Design with Diffractive Lenses" by D. Falkis and G. M. Morris, Photonics Spectra, November 1991, pps. 205-208, an article entitled "Binary Optics", by W. B. Veldkamp and T. J. McHugh, Scientific American, May 1992, pps. 92-97, an article entitled "Coherent addition of AlGaAs lasers using microlenses and diffractive coupling" by J. R. Leger et al., Appl. Phys. Lett. 52(21), 5/23/88, pps. 1771-1772, and an article entitled "Coherent Laser Beam Addition: An Application of Binary-Optics Technology" by J. R. Leger et al., The Lincoln Laboratory Journal, Vol. 1, No. 2, 1988 pps. 225-245. Also of interest are, by example, U.S. Pat. No. 3,547,546, issued May 4, 1966, "Multiple Image Forming Device" by H. Schier, U.S. Pat. No. 4,530,736, issued Jul. 23, 1985, "Method for Manufacturing Fresnel Phase Reversal Plate Lenses" by W. E. Mutter, and U.S. Pat. No. 4,994,664, issued Feb. 19, 1991, entitled "Optically Coupled Focal Plane Arrays Using Lenslets and Multiplexers" by W. B. Veldkamp.

During operation the array 1 is cooled to, by example, 77K. As seen in FIG. 1g, MWIR radiation, indicated by $(lambda)_1$, is absorbed in the MWIR material 14 while LWIR radiation, indicated by $(lambda)_2$, passes through the MWIR and SWIR material and is absorbed within the LWIR region 20. Thus, during operation of the array 1 IR readout electronics (not shown) are enabled to simultaneously detect current modulated in accordance with the flux intensity of both LWIR and MWIR radiation, while separate visible readout electronics (not shown) also simultaneously detects current modulated in accordance with the flux intensity of visible radiation.

Although the SWIR layer 16 forms heterojunctions 14a with the MWIR regions 14, it does not contribute significant numbers of SWIR photon-generated carriers since most SWIR radiation does not penetrate through the MWIR material. In this regard the filter 32 may be used at the radiation admitting backside surface of the array 1 to eliminate any SWIR-related response in the MWIR material 14. As a result junction 14a is responsive to substantially only MWIR radiation. The LWIR region 20 is provided with a thickness great enough to absorb a significant quantity of the LWIR radiation that penetrates the underlying MWIR material 14 and the SWIR layer 16. As a result the heterojunctions 20a formed between SWIR layer 1,6 and the LWIR regions 20 are responsive substantially only to LWIR radiation.

The device described thus far shows the use of the wells 12 for containing the MWIR material 14. However, other fabrication techniques are also within the scope of the invention, specifically fabrication techniques that form the MWIR material 14 upon, instead of within, the substrate 10 surface.

The invention has been described above in the context of an embodiment of a back-side illuminated semiconductor IR radiation detector comprised of $Hg_{(1.0-x)}Cd_xTe$, and a front-side illuminated visible radiation detector comprised of Si. It should be realized, however, that the invention can be practiced with IR radiation detectors comprised of other Group II-VI materials. The invention can also be practiced to fabricate IR detectors and/or visible detectors comprised of other materials than those expressly mentioned above. By example, other suitable materials for fabricating IR detectors include Group III-V materials such as GaAs, GaAlAs, GaSb, InSb, and InAs. Group IV materials other than Si, such as Ge, may also be employed for the visible detectors, as may Si/Ge combinations with III-V or II-VI materials. The invention may also be practiced with Group IV-VI materials such as PbSnTe and PbSSe. Furthermore, the two-color IR detector may be fabricated with HgCdTe, as illustrated, with HgZnTe, or with another suitable narrow bandgap semiconductor alloy or bandgap engineered material, such as Group III-V quantum wells or superlattices.

Furthermore, although shown in the context of the device wherein the Group II-VI material is epitaxially grown over the substrate 2, it is also within the scope of the invention to fabricate the substrate 10 and associated elements separately from the substrate 2 and its associated elements, and then to adhesively or otherwise bond the two substrates together.

The teaching of the invention may also be applied to the fabrication of two-color IR detectors having arrangements of radiation selective material other than the MWIR/SWIR/LWIR depicted, such as SWIR/SWIR/MWIR, MWIR/MWIR/LWIR, and LWIR/MWIR/VLWIR. The arrangement of photoresponsive material is such that incident IR radiation first encounters the shorter wavelength absorbing regions or layers 14 and 16. The longer wavelength radiation passes through these regions and into the region 20 where a significant portion of longer wavelength radiation is absorbed. The intervening common contact layer 16 may or may not substantially overlap the coverage of the region 14. The common contact layer may exhibit a slightly longer or a slightly shorter spectral cut-off than the region 14. By example, for a MWIR/MWIR/LWIR configuration, for detecting radiation within the spectral bands of 3–5 micrometers and 8–12 micrometers, the region 14 has a spectral cut-off of five micrometers, the common contact layer 16 a spectral cut-off of eight micrometers, and the region 20 a spectral cut-off of 12 micrometers.

In summary, the invention provides a visible radiation detector that also includes material selected to be simultaneously responsive to radiation selected from the group consisting essentially of MWIR radiation and LWIR radiation, SWIR radiation and MWIR radiation, LWIR radiation and VLWIR radiation, SWIR radiation and LWIR radiation, SWIR radiation and VLWIR radiation, MWIR radiation and VLWIR radiation, and combinations of the foregoing.

In all of these cases, the shorter wavelength visible radiation is absorbed and detected within the Si material, while the longer wavelengths of the IR radiation pass substantially unimpeded through the Si substrate 2 and into the Group II-VI material.

It should also be noted that the IR detector sites may be single color detectors, and need not be responsive to two-colors of IR radiation.

Figure 4:
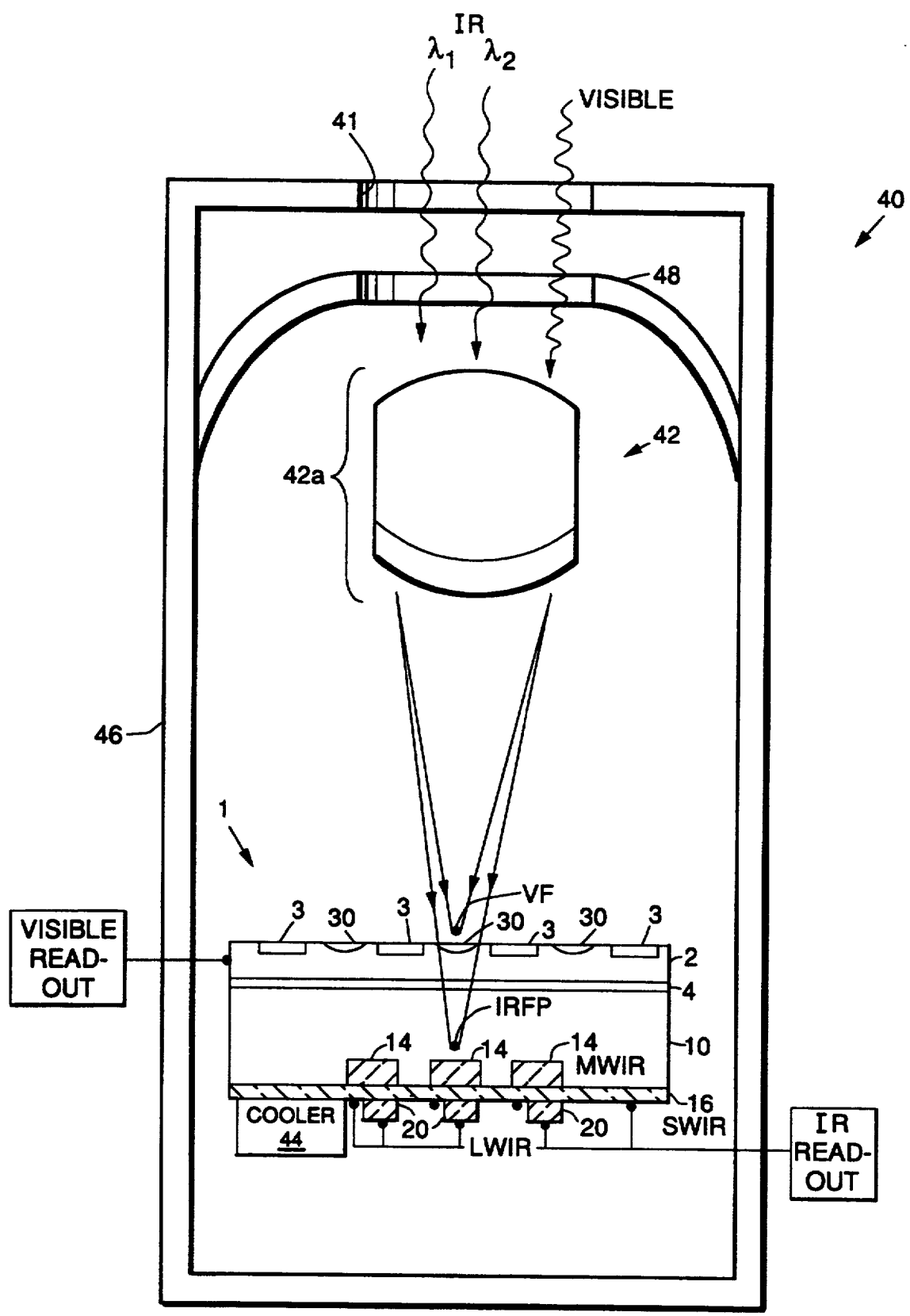
FIG. 4 illustrates an optical assembly that includes a visible/two-color IR radiation detector array fabricated in accordance with the invention and a common aperture through which the hybrid detector receives both visible and IR radiation.

Referring to FIG. 4 there is shown an assembly 40 that includes the hybrid visible/two-color IR array I and a common entrance aperture 41. It can be seen that the visible, MWIR, and LWIR sensitive devices are all at different distances from focusing optics 42. A cryogenic cooling apparatus 44 is also provided for operating the IR detectors at a suitable temperature, the assembly is contained within a dewar 46. A suitably shaped and positioned coldshield or a warmshield 48 may also De provided, if desired, for shielding the IR detectors from stray IR radiation.

In one embodiment of the assembly 40 the focussing optics 42 is comprised of diffractive optical elements in order to have the focus depth coincide with the position of each of the spectral band detectors. For example, a lens triplet 42a is employed. Such lens triplets are Known to be used to correct for chromatic aberrations resulting from an index of refraction change due to a change in wavelength. For the instant invention, the lens triplet 42a is provided so as to over-correct; that is, to move the visible focus (VF) ahead of the IR focus point (IRFP). As a result, the specification of the optical elements is coordinated with the detector design, specifically with the thickness of the silicon substrate 2, so that the focus of the visible image is at the plane of the visible silicon sensor, and the IR focus is at the MWIR and LWIR detector planes, respectively.

Thus, while the invention has been particularly shown and described with respect to preferred embodiments thereof, it will be understood by those skilled in the art that changes in form and details may be made therein without departing from the scope and spirit of the invention.

What is claimed is:

1. A visible radiation/two-color IR radiation detector: comprising:
    a first substrate having a plurality radiation detectors fabricated adjacent radiation receiving first surface of said first substrate, said first substrate having a second surface that is opposite the first surface; and
    a second substrate comprised of a Group II–VI semiconductor material, said second substrate having a first surface disposed over the second surface of said first substrate, said second substrate having a plurality of two-color IR radiation detectors fabricated adjacent to a second surface, the second surface of the substrate being opposite the first surface of the second substrate, each of said two-color IR radiation detectors including:
        a first HGCdTe region having a first electrical conductivity and a bandgap selected for absorbing radiation first IR spectral band;
        a second HgCdTe region having the first type of electrical conductivity and a bandgap selected for absorbing radiation within a second IR spectral band that differs from the first IR spectral band; and
        a third HgCdTe region having a second type of electrical conductivity that is opposite the first type of electrical conductivity, said third HgCdTe region being interposed between said first and said second HgCdTe regions for forming a first heterojunction with said first HgCdTe region and for forming a second heterojunction with said second HgCdTe region.

2. A visible radiation/two-color IR radiation detector as set forth in claim 1 and further including a lattice accommodation layer that is interposed between the second surface of the first substrate and the first surface of the second substrate.

3. A visible radiation/two-color IR radiation detector as set forth in claim 2 wherein said first substrate is comprised of Group IV material and wherein said lattice accommodation layer is comprised of a Group III–V semiconductor material.

4. A visible radiation/two-color IR radiation detector as set forth in claim 12 wherein said second substrate is comprised of CdZnTe.

5. A visible radiation/two-color IR radiation detector as set forth in claim 1 and further including a plurality of microlens means, individual ones of which are formed adjacent to the first surface of said first substrate in registration with one of said two-color IR detectors for focusing thereon IR radiation that is incident upon the first surface of said first substrate.

6. A visible radiation/two-color IR radiation detector as set forth in claim 1 and further including lens means disposed for focusing visible radiation upon the first surface of said first substrate and for focusing IR radiation upon said two-color IR detectors.

7. A visible radiation/two-color IR radiation detector as set forth in claim 12 wherein said visible radiation detectors are responsive to radiation within a range of wavelengths within a range of approximately 0.3 to approximately 1.2 micrometers, and wherein said plurality of two-color IR radiation detectors are each simultaneously responsive to radiation within two different spectral bands, the two different spectral bands each encompassing a portion of a range of wavelengths of approximately 1 micrometer to approximately 20 micrometers.

* * * * *